US012427762B2

(12) United States Patent
Yokoi

(10) Patent No.: US 12,427,762 B2
(45) Date of Patent: Sep. 30, 2025

(54) EXCHANGE UNIT AND PRINTING DEVICE

(71) Applicant: FUJI CORPORATION, Chiryu (JP)

(72) Inventor: Yoshimune Yokoi, Kiyosu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 18/555,909

(22) PCT Filed: Apr. 23, 2021

(86) PCT No.: PCT/JP2021/016429
§ 371 (c)(1),
(2) Date: Oct. 18, 2023

(87) PCT Pub. No.: WO2022/224430
PCT Pub. Date: Oct. 27, 2022

(65) Prior Publication Data
US 2024/0198654 A1 Jun. 20, 2024

(51) Int. Cl.
B41F 15/12 (2006.01)
H05K 3/34 (2006.01)

(52) U.S. Cl.
CPC ........... *B41F 15/12* (2013.01); *H05K 3/3485* (2020.08)

(58) Field of Classification Search
CPC .............................. B41F 15/12; H05K 3/3485
See application file for complete search history.

(56) References Cited

U.S. PATENT DOCUMENTS

2019/0337290 A1  11/2019  Hirukawa et al.
2021/0197545 A1*  7/2021  Yokoi ................. B41F 15/0881

FOREIGN PATENT DOCUMENTS

WO  WO-2014010084 A1 *  1/2014  .......... H05K 13/021
WO  WO 2018/105016 A1     6/2018
WO  WO-2019225002 A1 * 11/2019  .......... B41F 15/0836

OTHER PUBLICATIONS

International Search Report issued Jul. 6, 2021 in PCT/JP2021/016429, filed on Apr. 23, 2021, 2 pages.

* cited by examiner

Primary Examiner — David H Banh
(74) Attorney, Agent, or Firm — Oblon, McClelland, Maier &Neustadt, L.L.P.

(57) ABSTRACT

An exchanging unit for use in a printing device including a printing section to execute a printing process of printing a viscous fluid on a processing target object using a screen mask, and includes a receiving section configured to receive an accommodation rack having multiple shelf sections each configured to accommodate a frame that is capable of supporting an exchangeable member for use in the printing device, a lifting and lowering section configure to lift and lower the accommodation rack between an exchange position where to exchange the exchangeable member and a liftable position situated further downwards than the exchange position, and a moving section configured to move the accommodation rack between the liftable position where the accommodation rack can be lifted up by the lifting and lowering section and an accommodation position where the accommodation rack enters an interior of a housing of the printing device.

10 Claims, 13 Drawing Sheets

Fig. 6
Fig. 6A
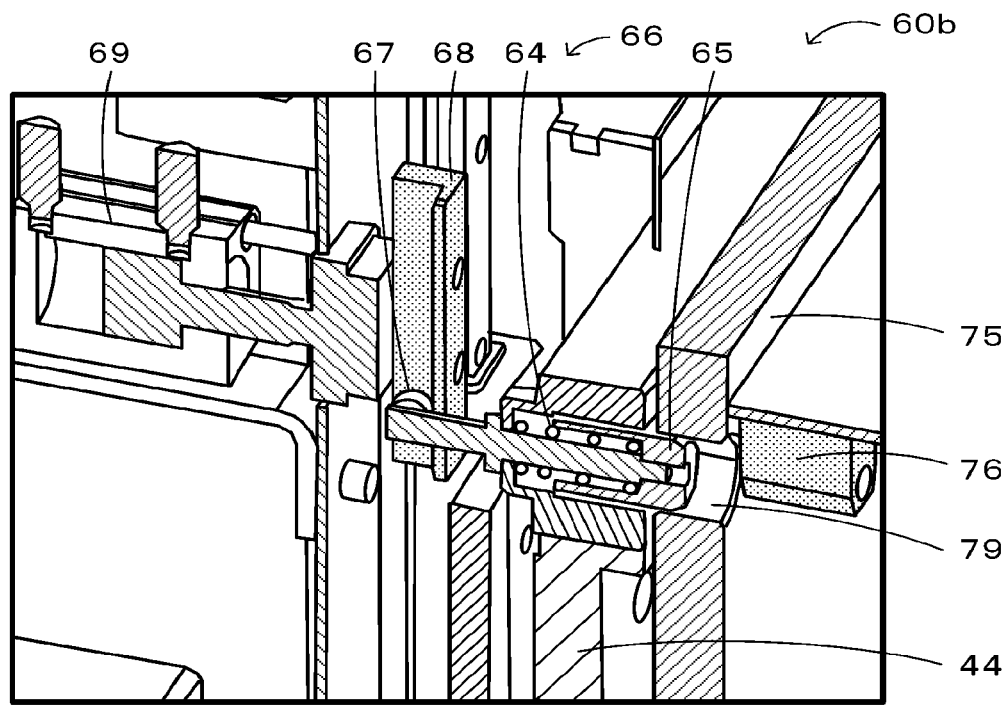
Fig. 6B
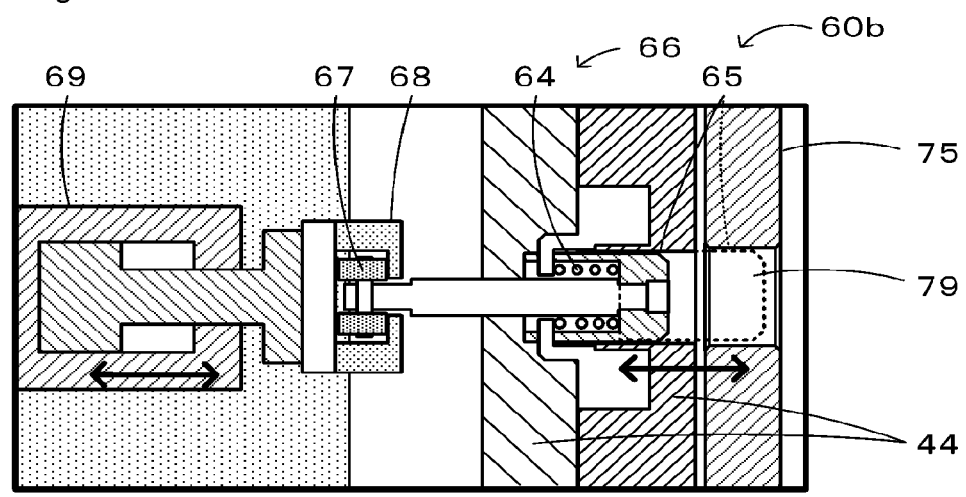

Fig. 10
Fig 10A
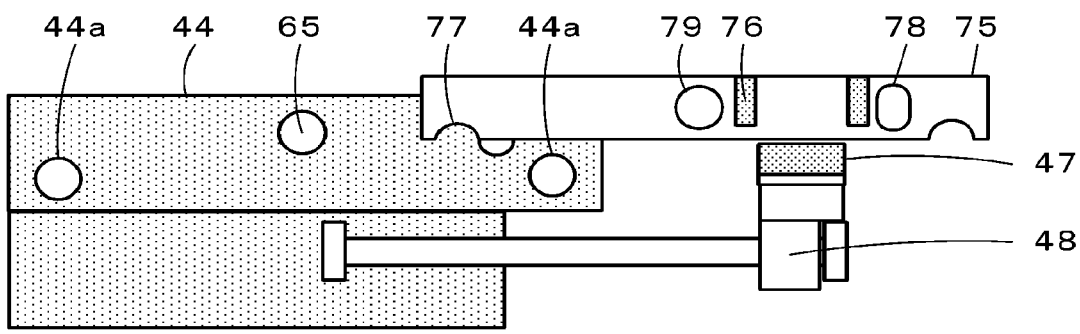
Fig. 10B
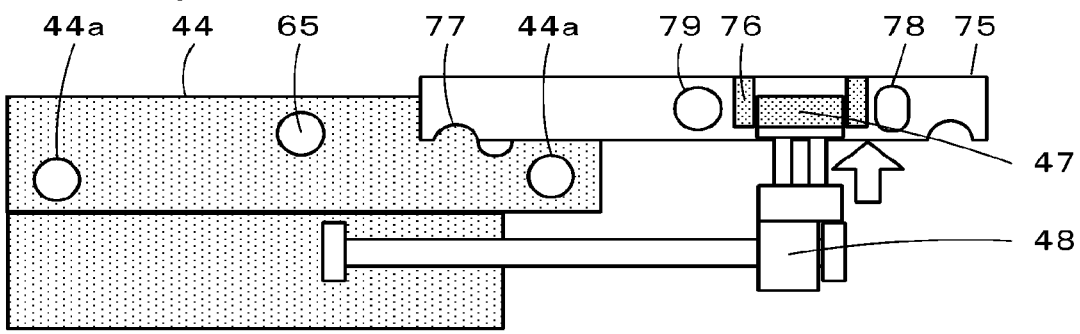
Fig. 10C
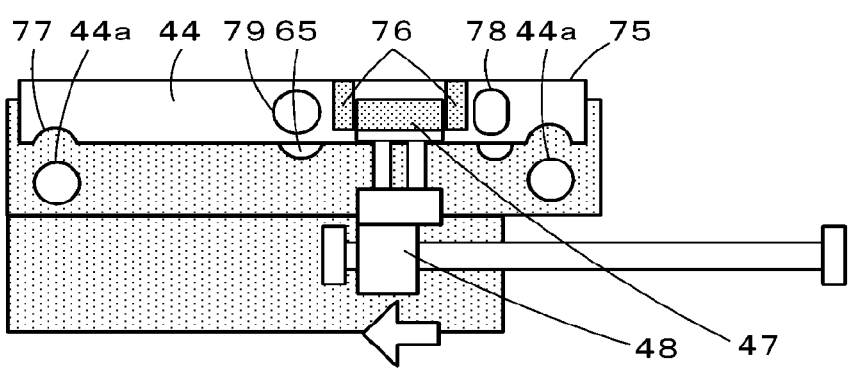
Fig. 10D
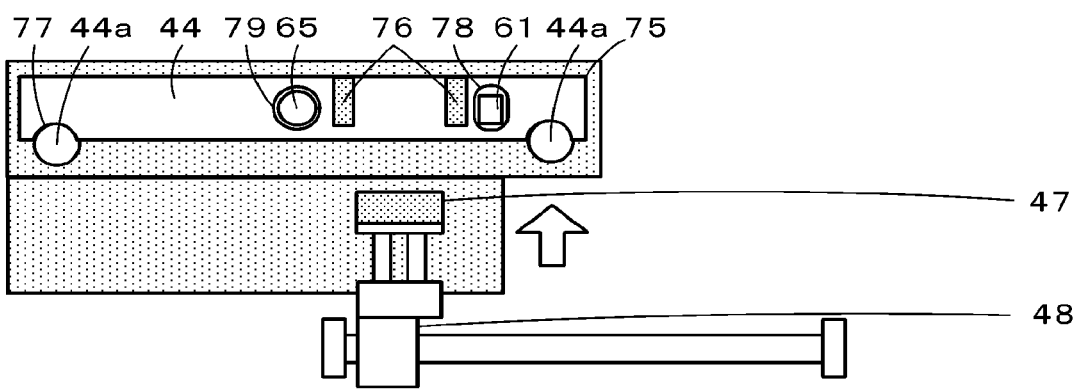

EXCHANGE UNIT AND PRINTING DEVICE

TECHNICAL FIELD

The present description relates to an exchange unit and a printing device.

BACKGROUND ART

In printing devices for executing a printing process of printing a viscous fluid on a printing target such as a board using a screen mask, there have conventionally been known, for example, printing devices configured to execute an automatic exchange of exchangeable members including, for example, a screen mask for use in the printing device. For example, Patent Literature 1 describes a printing device in which a storage device is placed in front of the printing device for automatic exchange of exchangeable members between the printing device and the storage device.

PATENT LITERATURE

Patent Literature 1: International Publication 2018/105016

BRIEF SUMMARY

Technical Problem

With the printing device described above, however, since the storage device which stores screen masks and which is configured to move upwards and downwards to and from an exchange position is disposed in front of the printing device, the operator has difficulty in working at a front surface of the printing device.

The present disclosure has been made in view of the problem described above, and a main object thereof is to provide an exchanging unit and a printing device that allows a more compact configuration for automatic exchange of exchangeable members for use in the printing device.

Solution to Problem

An exchanging unit and a printing device which are disclosed in the present description have adopted the following means for achievement of the main object described above.

According to an aspect of the present disclosure, there is provided an exchanging unit for use in a printing device including a printing section configured to execute a printing process of printing a viscous fluid on a processing target object using a screen mask, the exchanging unit including:
 a receiving section configured to receive an accommodation rack having multiple shelf sections each configured to accommodate a frame that is capable of supporting an exchangeable member for use in the printing device;
 a lifting and lowering section configure to lift and lower the accommodation rack between an exchange position where to exchange the exchangeable member and a liftable position situated further downwards than the exchange position; and
 a moving section configured to move the accommodation rack between the liftable position where the accommodation rack can be lifted up by the lifting and lowering section and an accommodation position where the accommodation rack enters an interior of a housing of the printing device.

With this exchange unit, since the exchangeable members can be lifted and lowered by lifting and lowering the whole of the accommodation rack which accommodates the exchangeable members in the multiple shelf sections, the necessity of providing a lifting and lowering mechanism inside the accommodation rack is obviated, thereby making it possible to make the accommodation rack itself compact in size. In addition, with this exchange unit, since the accommodation rack can be put in a state in which the accommodation rack is pulled in to stay inside the housing of the printing device, for example, when the accommodation rack is not used for exchange of the exchangeable members, the printing device itself can also be made compact in size. In this way, the exchange unit allows a more compact configuration for automatic exchange of the exchangeable members for use in the printing device.

BRIEF DESCRIPTION OF DRAWINGS

FIG. 6 is an explanatory diagram showing an example of stopper section 60b of fixing section 60.

FIG. 10 is an explanatory diagram showing positional relationships among members involved when accommodation rack 70 is moved.

DESCRIPTION OF EMBODIMENTS

Figure 1:
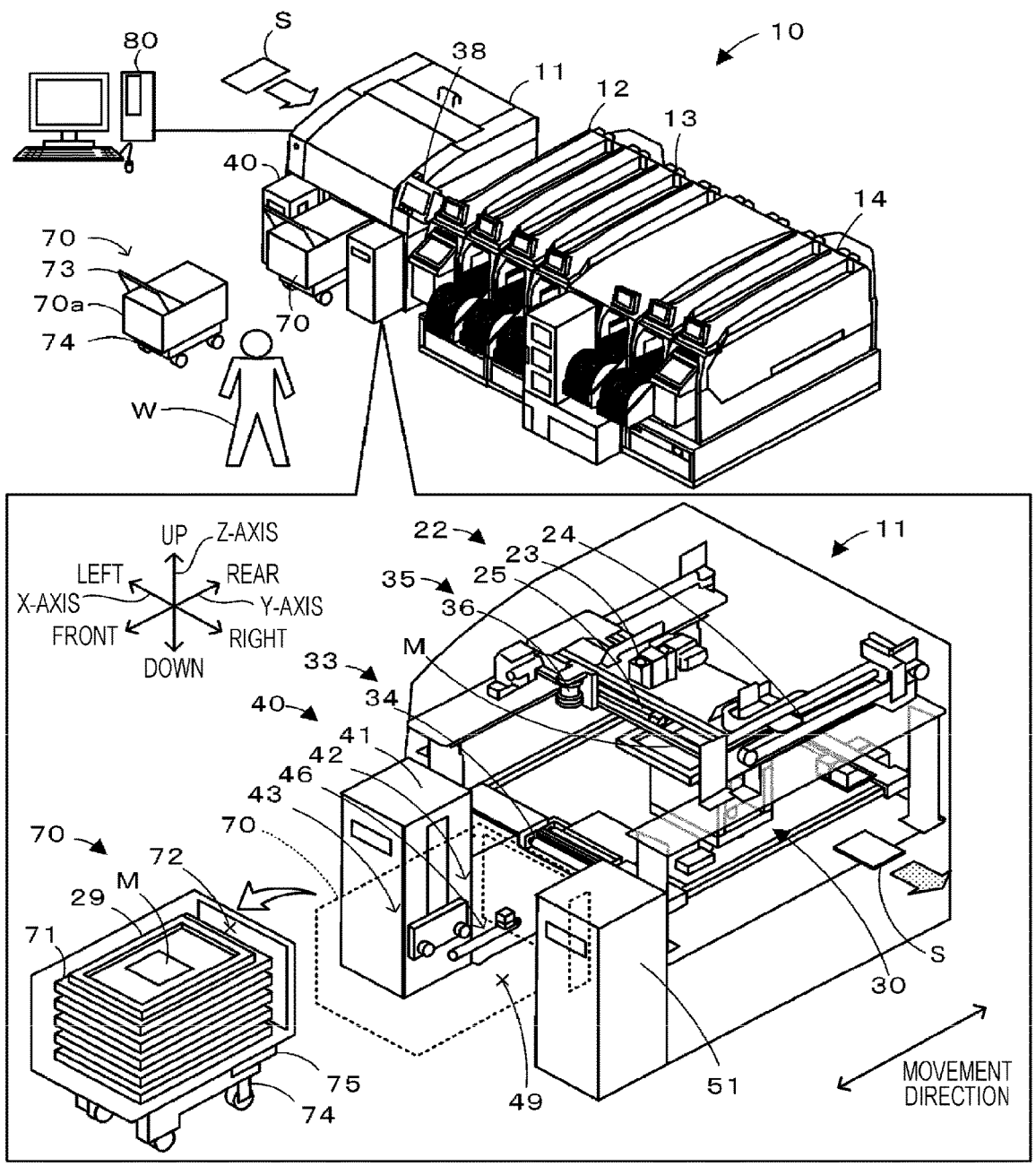
FIG. 1 is a schematic explanatory diagram showing an example of mounting system 10 and printing device 11.
Figure 2:
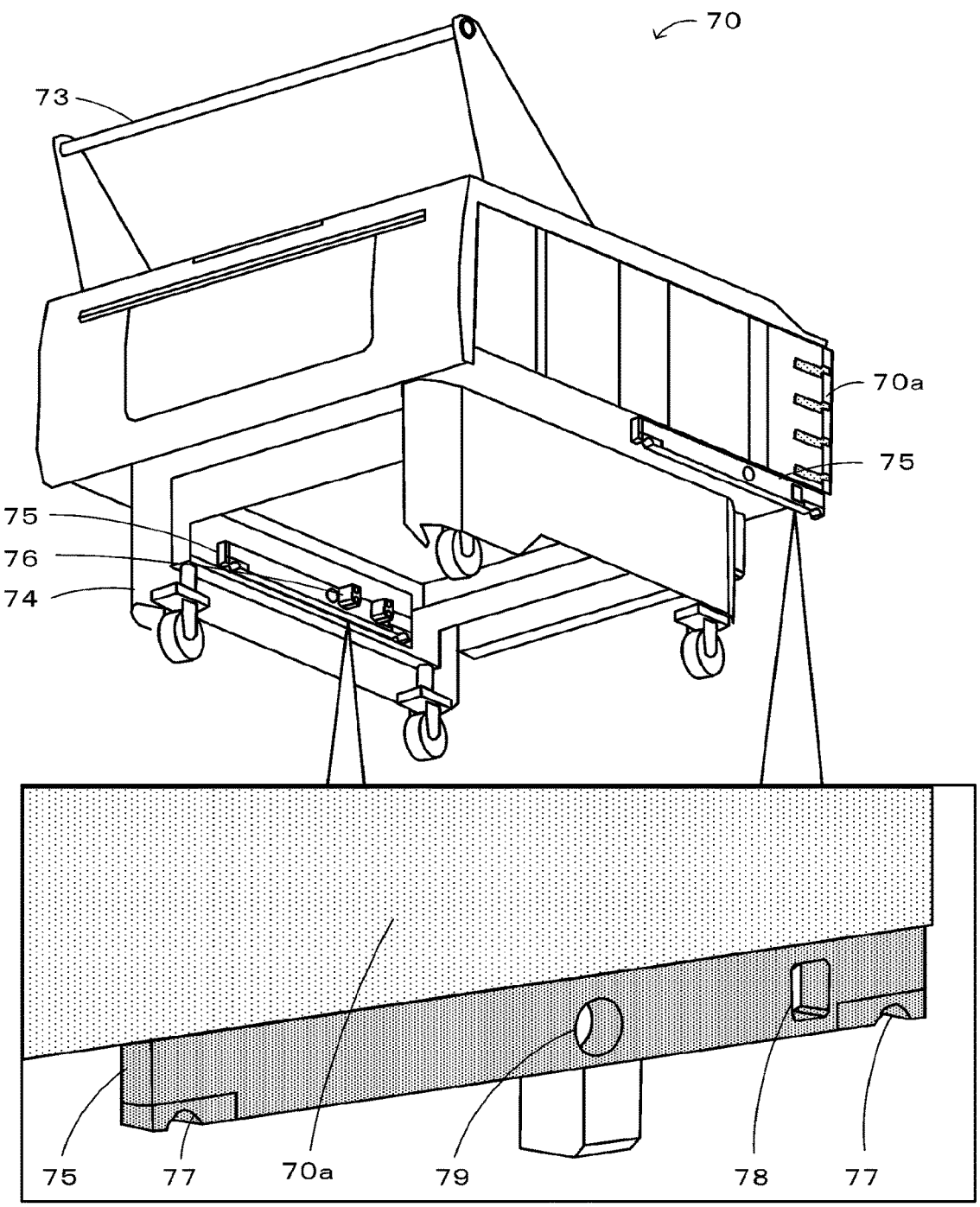
FIG. 2 is a schematic explanatory diagram showing accommodation rack 70.
Figure 3:
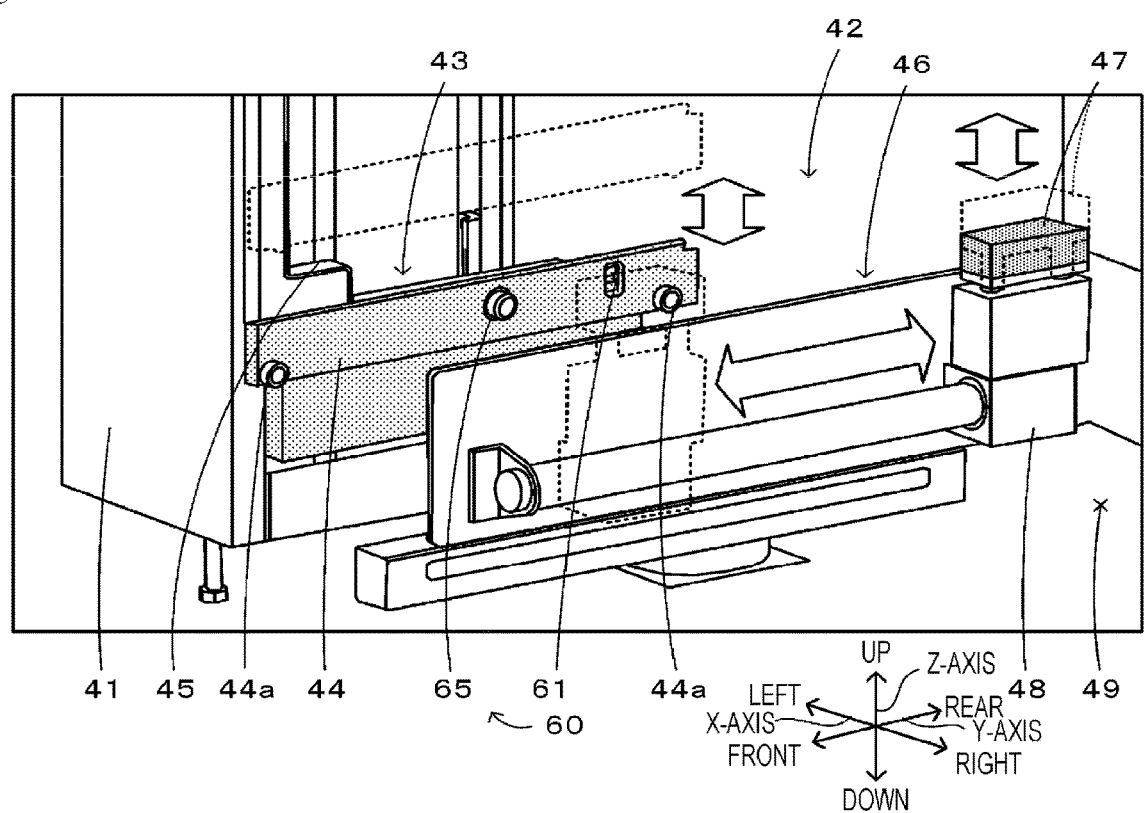
FIG. 3 is an explanatory diagram showing an example of lifting and lowering section 43 and forward-backward moving section 46.
Figure 4:
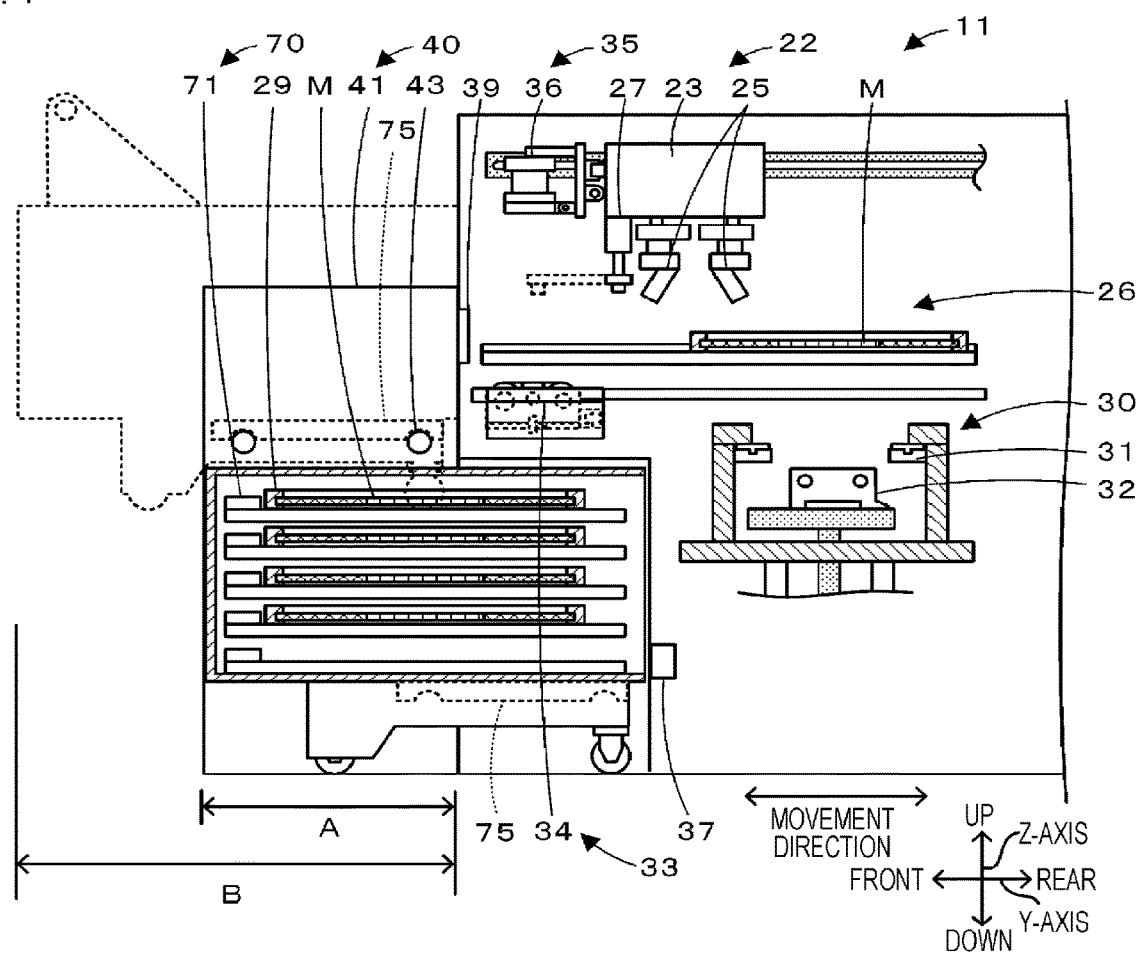
FIG. 4 is an explanatory diagram showing an example of printing device 11, exchanging unit 40, and accommodation rack 70.
Figure 5:
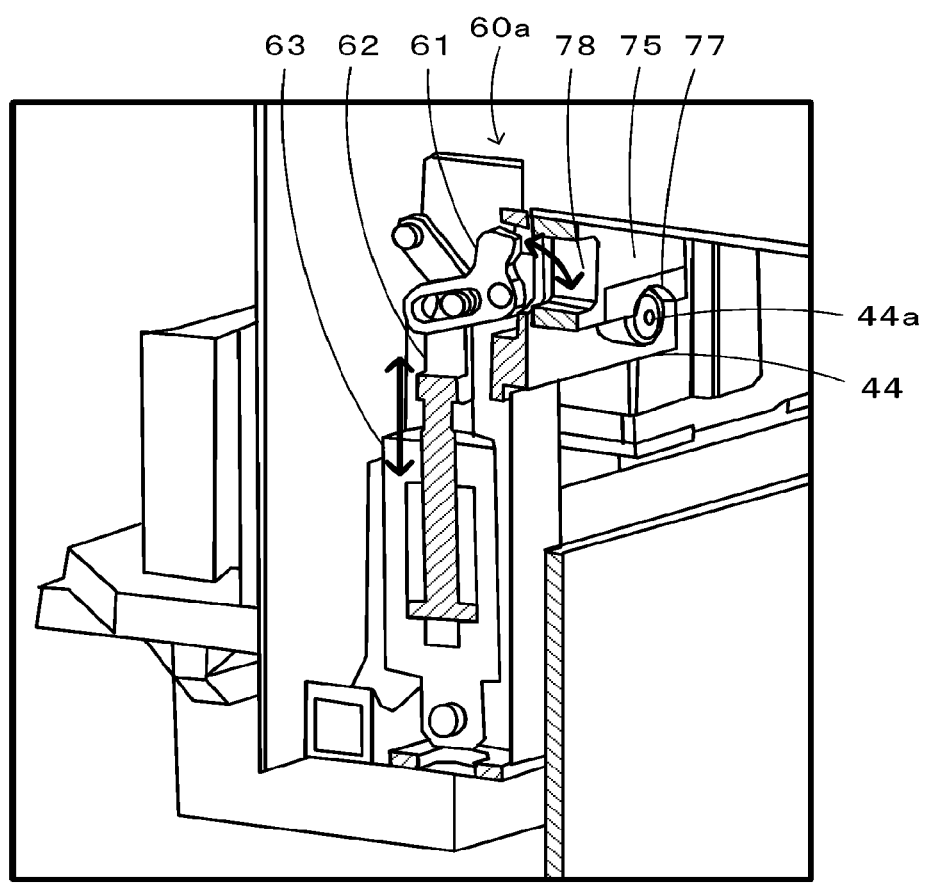
FIG. 5 is an explanatory diagram showing an example of clamp section 60a of fixing section 60.
Figure 7:
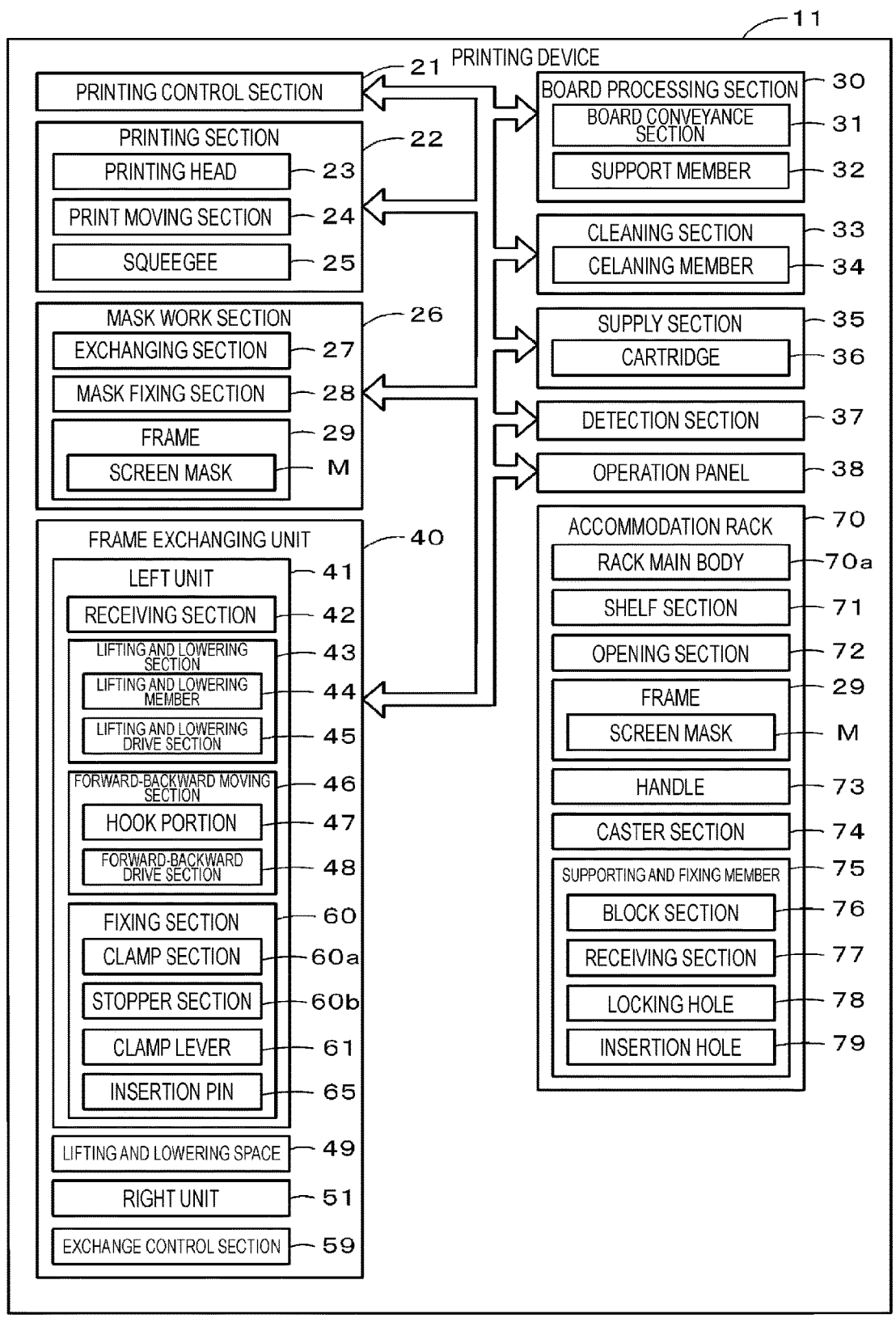
FIG. 7 is a block diagram showing an electrical connection relationship of printing device 11.

Hereinafter, an embodiment of the present disclosure will be described by reference to drawings. FIG. 1 is a schematic explanatory diagram showing an example of mounting system 10 including printing device 11 and an example of printing device 11 according to the present disclosure. FIG. 2 is a schematic explanatory diagram showing accommodation rack 70. FIG. 3 is an explanatory diagram showing an example of lifting and lowering section 43 and forward-backward moving section 46. FIG. 4 is an explanatory diagram showing an example of printing device 11, exchanging unit 40, and accommodation rack 70. FIG. 5 is an explanatory diagram showing an example of clamp section 60a of fixing section 60. FIG. 6 is an explanatory diagram showing an example of stopper section 60b of fixing section 60, in which FIG. 6A is a perspective view including sections of a part of constituent members such as insertion pin 65, and FIG. 6B is a sectional plan view as viewed from top. FIG. 7 is a block diagram showing an electrical connection relationship of printing device 11. This mounting system 10 includes printing device 11, print inspection device 12, mounting device 13, mounting inspection device 14, a reflow device, not shown, and management computer (PC) 80. Mounting system 10 is configured as a mounting line in which multiple mounting devices 13 for mounting a component on board S are arranged on a downstream side of printing device 11. In the present embodiment, a left-right direction (an X-axis), a front-rear direction (a Y-axis), and an up-down direction (a Z-axis) are as shown in FIGS. 1, 3, and 4.

Print inspection device 12 is a device for inspecting the state of a viscous fluid such as solder paste which is printed on board S by printing device 11. Mounting device 13 is a device for mounting a component on board S on which the viscous fluid is printed by printing device 11. Mounting inspection device 14 is a device for inspecting the state of a component mounted on board S. The reflow device is a device for heating and melting the printed viscous fluid so as to make it secure on to board S. Management PC 80 is a device for managing information on the constituent devices of mounting system 10. This management PC 80 manages a progress status of each of the constituent devices set along the production line where to execute a mounting process.

As shown in FIGS. 1 to 7, printing device 11 is a device for applying (printing) solder, as a viscous fluid, which lies on screen mask M to (on) board S, as a processing target object, which lies below through a pattern hole formed in the screen mask M by forcing the solder into the pattern hole using squeegees 25. Here, as the "processing target object", there is raised, for example, board S on which a component is mounted, abase material which is a three-dimensional object, or the like. As the "viscous fluid", there is raised a solder paste or a conductive paste, an adhesive, or the like. Here, the following description will be made based on the understanding that board S and a solder paste are employed as examples. Screen mask M is fixed in place inside frame 29. Frame 29 can fix screen masks M of multiple sizes, and is sized to be accommodated in shelf section 71 in accommodation rack 70 (refer to FIG. 1). As shown in FIG. 3, printing device 11 includes printing control section 21, printing section 22, mask work section 26, board processing section 30, cleaning section 33, supply section 35, detection section 37, operation panel 38, and exchanging unit 40.

Printing control section 21 is configured as a microprocessor which mainly includes CPU and controls the whole of printing device 11. Printing control section 21 outputs a signal to management PC 80 as an external device in addition to printing section 22, mask work section 26, board processing section 30, cleaning section 33, supply section 35, operation panel 38, and exchanging unit 40. In addition, printing control section 21 receives a signal, as an input, from management PC 80 as the external device in addition to printing section 22, mask work section 26, board processing section 30, cleaning section 33, supply section 35, detection section 37, operation panel 38, and exchanging unit 40. This printing control section 21 has a storage section for storing information on board S on to which a printing process is executed, a printing process program for executing a printing process on to board S, a member exchange process program for causing exchanging section 27 to execute an exchange process of frames 29, and the like.

Printing section 22 is disposed at an upper stage of printing device 11, constituting a unit for executing a printing process of printing a viscous fluid on board S using screen mask M. As shown in FIGS. 1, 4, and 7, printing section 22 includes printing head 23, print moving section 24, a squeegee lifting and lowering section, not shown, and squeegees 25. Print moving section 24 moves printing head 23 in a predetermined printing direction (here, the front-rear direction), and includes a guide formed in the front-rear direction, a slider configured to move along the guide, and a motor for driving the slider. Squeegees 25 are disposed on a lower surface side of printing head 23 and are lifted and lowered by the squeegee lifting and lowering section. Printing section 22 has two squeegees 25 which are individually used in the front-rear direction for use. As shown in FIG. 4, mask work section 26 is disposed between printing section 22 and board processing section 30 in the up-down direction, constituting a unit for fixedly holding screen mask M. As shown in FIG. 7, mask work section 26 includes exchanging section 27 and mask fixing section 28. Exchanging section 27 is a conveyance rod provided on printing head 23, and is lowered to a position where to be brought into abutment with screen mask M by an air cylinder, not shown, and is rotated, so that an abutting section configured to be brought into abutment with frame 29 is moved in the front-rear direction, too (refer to dashed lines in FIG. 4). Printing head 23 and exchanging section 27 are configured to be brought into engagement with frame 29 between shelf section 71 at a predetermined height in accommodation rack 70 and printing section 22 to move the frame 29. Mask fixing section 28 positions screen mask M, and supports and fixes the screen mask M in a horizontal posture. Screen mask M is pushed by exchanging section 27 and is then caused to move in the front-rear direction along the guide of mask work section 26 to thereby be fixed by mask fixing section 28. As shown in FIG. 4, board processing section 30 is disposed below mask work section 26, constituting a unit for loading board S, positioning and supporting loaded board S, and causing board S to move towards for contact with and away from screen mask M. Board processing section 30 includes board conveyance section 31 for conveying board S in the left-right direction, support member 32 for supporting board S from below, and a board lifting and lowering section for lifting and lowering the whole of board processing section 30 and support member 32. Cleaning section 33 is disposed between mask work section 26 and board processing section 30 in the up-down direction, constituting a unit for executing a cleaning process of cleaning a rear surface of screen mask M. Cleaning section 33 has cleaning member 34, whereby this cleaning member 34 is brought into abutment with screen mask M to clean it. Supply section 35 constitutes a unit for supplying solder accommodated in cartridge 36 on to screen mask M. Supply section 35 is disposed in front of printing head 23. Supply section 35 applies a pressure to cartridge 36 so as to cause the cartridge 36 to discharge the solder therefrom. Cleaning member 34 and cartridge 36 are consumables and are then exchanged as required. Detection section 37 constitutes a sensor for detecting whether accommodation rack 70 exists in a front interior portion of printing device 11. Operation panel 38 constitutes a unit for not only receiving an input from operator W but also presenting information to the operator W. This operation panel 38 includes a display section, which is a display, and an operation section of a touch panel type having a button.

Accommodation rack 70 constitutes an accommodation body for accommodating frame 29 that is capable of supporting screen mask M as an exchangeable member for a printing process to be executed in printing section 22. As shown in FIGS. 1, 2, and 7, accommodation rack 70 has rack main body 70a, handle 73, caster section 74, and supporting and fixing member 75. Rack main body 70a has multiple shelf sections 71 and one opening section 72. Shelf sections 71 are disposed in such a manner as to be aligned at predetermined intervals in the up-down direction so that frames 29 each supporting screen mask M can be placed in the up-down direction. Opening section 72 communicates with an outside such as printing section 22, and frame 29 is loaded and unloaded through this opening section 72. This accommodation rack 70 only accommodates frames 29 and has neither a driving section for moving frame 29 nor a driving section for lifting and lowering frame 29. With this accommodation rack 70, the configuration can be simplified more. Shelf section 71 has a size which can deal with frame sizes for various types of exchangeable members. That is, shelf section 71 is formed into a size which can accommodate a largest frame 29. Each accommodation rack 70 may have shelf sections 71 which respectively correspond to frame sizes for various types of exchangeable members, or may have multiple shelf sections 71 whose sizes are the same. In the latter case, multiple accommodation racks 70 having the same external size may be prepared, and shelf sections 71 of each accommodation rack 70 may correspond to any one of frame sizes for various types of exchangeable members. In this case, although the number of types of accommodation racks 70 is increased, even though frame sizes for various types of exchangeable members are different, since the external sizes of accommodation racks 70 are the same, the individual accommodation racks 70 can share receiving section 42. Handle 73 is fixed to an upper part of rack main body 70a. Handle 73 includes a rod-shaped member gripped by operator W and a support member for fixing the rod-shaped member. Caster section 74 is disposed at a lower portion of rack main body 70a. This caster section 74 includes a structure having a space in the center thereof and casters which are disposed on a lower surface side of the structure and which each have a wheel. Operator W grips this handle 73 to move accommodation rack 70 (refer to FIG. 8 described later).

Supporting and fixing member 75 is a plate-shaped member which is fixed to front left and right end portions on a lower surface side of rack main body 70a. This supporting and fixing member 75 constitutes a member for use for connection to exchanging unit 40. As shown in FIG. 2, supporting and fixing member 75 has block section 76, receiving section 77, locking hole 78, and insertion hole 79. Block section 76 constitutes a member to which hook portion 47 provided on exchanging unit 40 is connected, and a space into which hook portion 47 is inserted is defined between two blocks. Receiving section 77 constitutes a section for receiving cam followers 44a disposed on lifting and lowering member 44 provided on exchanging unit 40 and has arc-shaped notches. Locking hole 78 constitutes a through hole into which clamp lever 61 of fixing section 60 disposed on lifting and lowering member 44 of exchanging unit 40 is inserted. Insertion hole 79 constitutes a through hole into which insertion pin 65 of fixing section 60 disposed on lifting and lowering member 44 of exchanging unit 40 is inserted.

Exchanging unit 40 is used in printing device 11 including printing section 22 for executing a printing process of printing a viscous fluid on a processing target object using screen mask M. Exchanging unit 40 is configured as a device for receiving accommodation rack 70 which accommodates exchangeable members such as screen masks M which are fixed to frames 29 to lift and lower accommodation rack 70. Exchanging unit 40 has left unit 41 and right unit 51 which function as a lifting and lowering section and a moving section of the present disclosure. Left unit 41 is disposed at a front left side of a housing of printing device 11. Right unit 51 is disposed at a front right side of the housing of printing device 11. As shown in FIG. 4, left unit 41 and right unit 51 are formed such that length A extending along a movement direction of frame 29 is shorter than length B of accommodation rack 70. This exchanging unit 40 has lifting and lowering space 49 at a center between left unit 41 and right unit 51 for lifting and lowering accommodation rack 70. As shown in FIG. 4, this exchanging unit 40 accommodates accommodation rack 70 in the same surface as a front surface of a main body of exchanging unit 40 or further inwards than the front surface of the main body when accommodation rack 70 stays in an accommodation position, whereas when accommodation rack 70 stays in an exchange position, exchanging unit 40 supports accommodation rack 70 in a position which protrudes further than the front surface of the main body of exchanging unit 40. Here, a detailed description of right unit 51 is omitted based on the understanding that right unit 51 has the same configuration as that of left unit 41 excluding that right unit 51 faces left unit 41. Here, right unit 51 includes a receiving section, a lifting and lowering section, a lifting and lowering member, a cam follower, a lifting and lowering drive section, a forward-backward moving section, a hook portion, a forward-backward drive section, and the like.

Left unit 41 includes receiving section 42, lifting and lowering section 43, forward-backward moving section 46, and fixing section 60. Receiving section 42 receives accommodation rack 70 which has multiple shelf sections 71 accommodating frames 29 that is capable of supporting an exchangeable member for use in printing device 11 and supports this accommodation rack 70 from a lower surface side to lift and lower that accommodation rack 70. Lifting and lowering section 43 lifts and lowers accommodation rack 70 between an exchange position where to exchange exchangeable members and a liftable position which lies further downwards than the exchange position. As shown in FIG. 3, this lifting and lowering section 43 includes lifting and lowering member 44 and lifting and lowering drive section 45. Lifting and lowering member 44 constitutes a plate-shaped member provided on a surface of left unit 41 which faces right unit 51. This lifting and lowering member 44 is caused to move up and down along an inner surface of a housing of left unit 41 by lifting and lowering drive section 45. Cam follower 44a is disposed at front and rear end portions of lifting and lowering member 44. Cam follower 44a supports supporting and fixing member 75 disposed on accommodation rack 70 from below and moves up and down accommodation rack 70 as lifting and lowering member 44 moves up and down. Lifting and lowering drive section 45 may be configured to have a ball screw having a lifting and lowering shaft and a drive motor so as to move up and down lifting and lowering member 44 or may be configured to move up and down lifting and lowering member 44 using a linear motor. In addition, this lifting and lowering section 43 has fixing section 60 for restricting accommodation rack 70 from moving in a horizontal direction and/or falling when accommodation rack 70 moves to the liftable position to be put in a state in which accommodation rack 70 can be lifted and lowered.

Forward-backward moving section 46 is configured to move accommodation rack 70 between the liftable position where accommodation rack 70 can be lifted and lowered by lifting and lowering section 43 and the accommodation position where accommodation rack 70 enters the interior portion of the housing of printing device 11. Forward-backward moving section 46 moves accommodation rack 70 in the horizontal direction. This forward-backward moving section 46 includes hook portion 47 and forward-backward drive section 48. Hook portion 47 constitutes a member which is disposed on a shaft of forward-backward drive section 48 in such a manner as to be lifted and lowered, whereby hook portion 47 is lifted up towards block section 76 provided on accommodation rack 70 for engagement with this block section 76. Forward-backward drive section 48 is configured to move hook portion 47 between the accommodation position and the liftable position. Forward-backward drive section 48 may be configured to have a ball screw and a drive motor so as to move hook portion 47 forwards and backwards or may be configured to move hook portion 47 forwards and backwards using a linear motor.

Exchanging unit 40 has exchange control section 59. Exchange control section 59 is implemented by a microprocessor which mainly includes CPU and controls the whole of exchanging unit 40. Exchange control section 59 outputs a signal to printing control section 21 in addition to lifting and lowering drive section 45 and forward-backward drive section 48. In addition, exchange control section 59 receives a signal as an input from printing control section 21. Upon receipt of a signal informing that accommodation rack 70 has been received in receiving section 42, this exchange control section 59 executes a process of lifting up hook portion 47 so as to bring this hook portion 47 into engagement with block section 76. In addition, exchange control section 59 executes a process of causing forward-backward moving section 46 to move accommodation rack 70 from the accommodation position to the liftable position and causing lifting and lowering section 43 to lift up accommodation rack 70 from the liftable position to the exchange position for exchange of exchangeable members. In addition, when the exchange of exchangeable members ends, exchange control section 59 causes lifting and lowering section 43 to lower accommodation rack 70 from the exchange position to the liftable position and causing forward-backward moving section 46 to move accommodation rack 70 from the liftable position to the accommodation position.

Fixing section 60 constitutes a safety mechanism for preventing accommodation rack 70 from moving or falling unintentionally when accommodation rack 70 is lifted and lowered by lifting and lowering section 43. Fixing section 60 includes clamp section 60a and stopper section 60b. As shown in FIG. 5, clamp section 60a has clamp lever 61 configured to be inserted into locking hole 78 formed in supporting and fixing member 75 of accommodation rack 70, and is a mechanism for restricting accommodation rack 70 from moving in the horizontal direction. Clamp section 60a is disposed on lifting and lowering member 44 so as to be lifted up and lowered together with lifting and lowering member 44. This clamp section 60a includes clamp lever 61, lever rotating section 62, and air cylinder 63. Clamp lever 61 has a lever configured to be inserted into locking hole 78, a rotation shaft fixed to lifting and lowering member 44 to rotate the lever, and an elliptic hole into which a pin of lever rotating section 62 is inserted. Lever rotating section 62 is a member which is coupled directly to a rod of air cylinder 63 for linear movement. A pin is disposed at a distal end of lever rotating section 62 so as to be inserted in the elliptic hole. Air cylinder 63 constitutes a drive section in which the rod is moved up and down by means of compressed air which is supplied from an air supply device, not shown. In this clamp section 60a, when the rod of air cylinder 63 is lifted up, clamp lever 61 rotates about the rotation shaft, whereby the lever is inserted into locking hole 78. In addition, in this clamp section 60a, when the rod of air cylinder 63 is lowered, clamp lever 61 rotates about the rotation shaft, whereby the lever inserted in locking hole 78 is released therefrom.

As shown in FIG. 6, stopper section 60b has insertion pin 65 configured to be inserted into insertion hole 79 formed in supporting and fixing member 75 of accommodation rack 70, constituting a mechanism for preventing this accommodation rack 70 from falling as a result of that insertion pin 65 being inserted into that insertion hole 79 when this accommodation rack 70 is lifted up. This stopper section 60b has insertion pin 65 and pin drive section 66. Pin drive section 66 causes insertion pin 65 to be inserted into insertion hole 79 when accommodation rack 70 is lifted up from the liftable position, whereas when accommodation rack 70 stays in the liftable position, pin drive section 66 causes insertion pin 65 to be pulled in so as to release insertion pin 65 from insertion hole 79. This pin drive section 66 includes spring 64, cam follower 67, guide member 68, and air cylinder 69. Insertion pin 65, spring 64, and cam follower 67 are disposed on lifting and lowering member 44 and are lifted and lowered together with lifting and lowering member 44. Meanwhile, guide member 68 and air cylinder 69 are disposed in the liftable position on the housing side of exchanging unit 40 and are neither lifted nor lowered. Spring 64 is a member for biasing insertion pin 65 towards insertion hole 79 at all times. Insertion pin 65 constitutes a member configured to be inserted into insertion hole 79 and is a cylindrical member having an interior space. Spring 64 is disposed in the interior space of insertion pin 65. Cam follower 67 is disposed at a rear end of insertion pin 65. This cam follower 67 is brought into abutment with a wall section of guide member 68 so as to be lifted and lowered together with lifting and lowering member 44 while being guided by guide member 68. Guide member 68 constitutes a member having a shape in which two members, which each have an L-shaped cross section and whose longitudinal direction follows the up-down direction, face each other. In this guide member 68, an L-shaped wall section is formed in the up-down direction, so that cam follower 67 moves along this wall section. Guide member 68 is fixed to a rod of air cylinder 69. Air cylinder 69 constitutes a drive section for driving the rod in a horizontal direction by means of compressed air supplied from an air supply device, not shown. This stopper section 60b is such that with lifting and lowering member 44 staying in the liftable position, when the rod of air cylinder 69 is pushed out, causing a state in which insertion pin 65 biased by spring 64 projects from lifting and lowering member 44 (refer to FIG. 6A). In addition, stopper section 60b is such that with lifting and lowering member 44 staying in the liftable position, when the rod of air cylinder 69 is pulled in, causing a state in which insertion pin 65 is pulled in via guide member 68 and cam follower 67 so as not to project from lifting and lowering member 44 (refer to FIG. 6B). Further, stopper section 60b is such that when lifting and lowering member 44 is lifted from the liftable position, cam follower 67 is released from the abutment with guide member 68, causing a state in which insertion pin 65 is inserted in insertion hole 79 at all times by means of the biasing force of spring 64.

Figure 8:
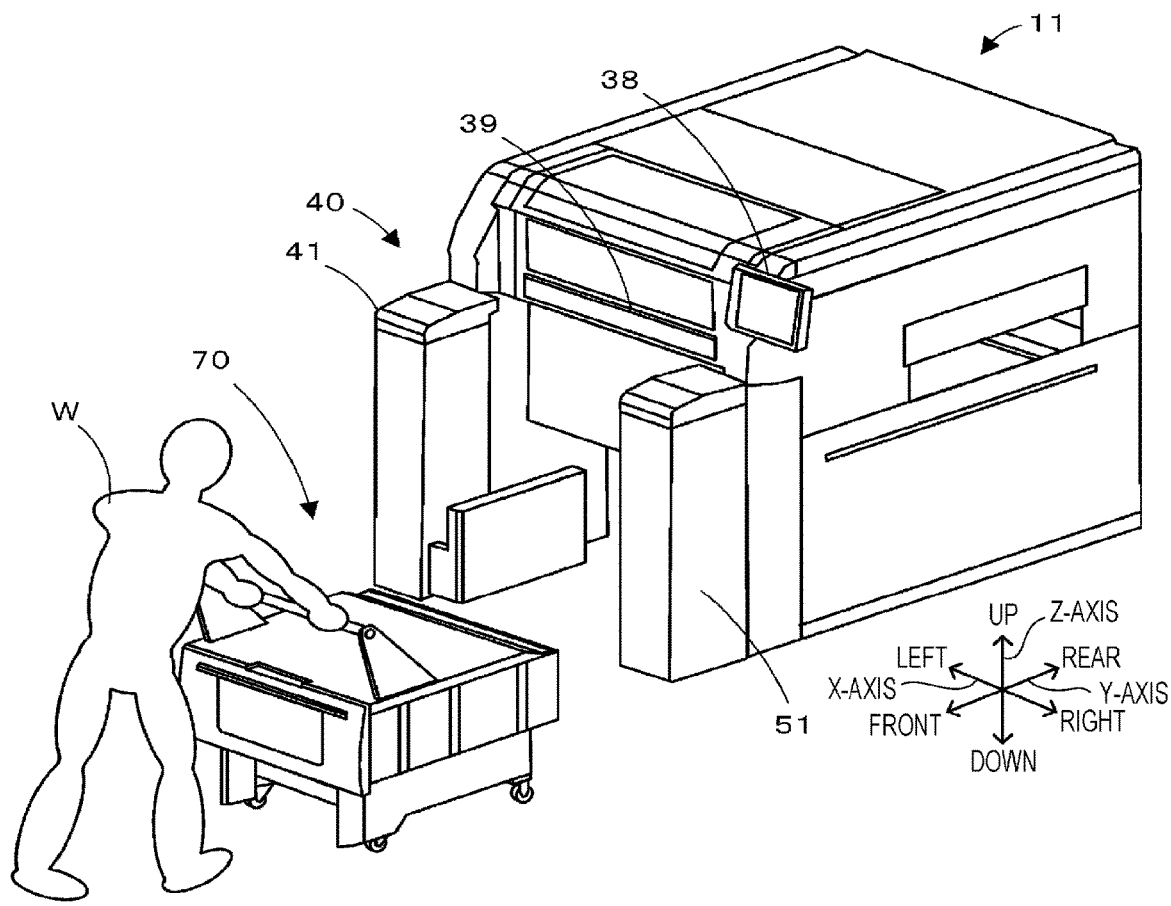
FIG. 8 is an explanatory diagram illustrating a way by which operator W moves accommodation rack 70 to exchanging unit 40.

Next, a printing process will be described which is executed by printing device 11 configured as described heretofore. Operator W performs an operation of attaching accommodation rack 70 in exchanging unit 40 to execute a printing process. FIG. 8 is an explanatory diagram illustrating a way by which operator W moves accommodation rack 70 to exchanging unit 40. Operator W inputs an execution of a printing process from operation panel 38 after operator W has attached accommodation rack 70 in exchanging unit 40. A printing process routine for executing a printing process is stored in the storage section of printing control section 21, and the printing process routine is executed after printing control section 21 has received a printing process execution command as an input from operator W. When the printing process routine is started, firstly, CPU of printing control section 21 performs a process of bringing board S into abutment with screen mask M by causing board processing section 30 to convey, fix, and lift up board S. For this, CPU causes mask work section 26 to adjust the position of screen mask M so as to execute a positional alignment of the pattern hole with board S. Subsequently, CPU causes cartridge 36 to move above screen mask M and then causes cartridge 36 to discharge solder on to the screen mask M. Subsequently, CPU causes printing head 23 to move while causing squeegees 25 to lower, and then causes squeegees 25 not only to be brought into abutment with an upper surface of screen mask M but also to move in the front-rear direction, so that the solder is printed on board S. In this way, printing control section 21 executes the printing on board S by performing the printing process including the board conveyance and fixation process, the solder supply process, and the squeegee moving process. CPU repeatedly performs this printing process while exchanging screen masks M until the production process of producing every type of board S in the production plan is completed.

Figure 9:
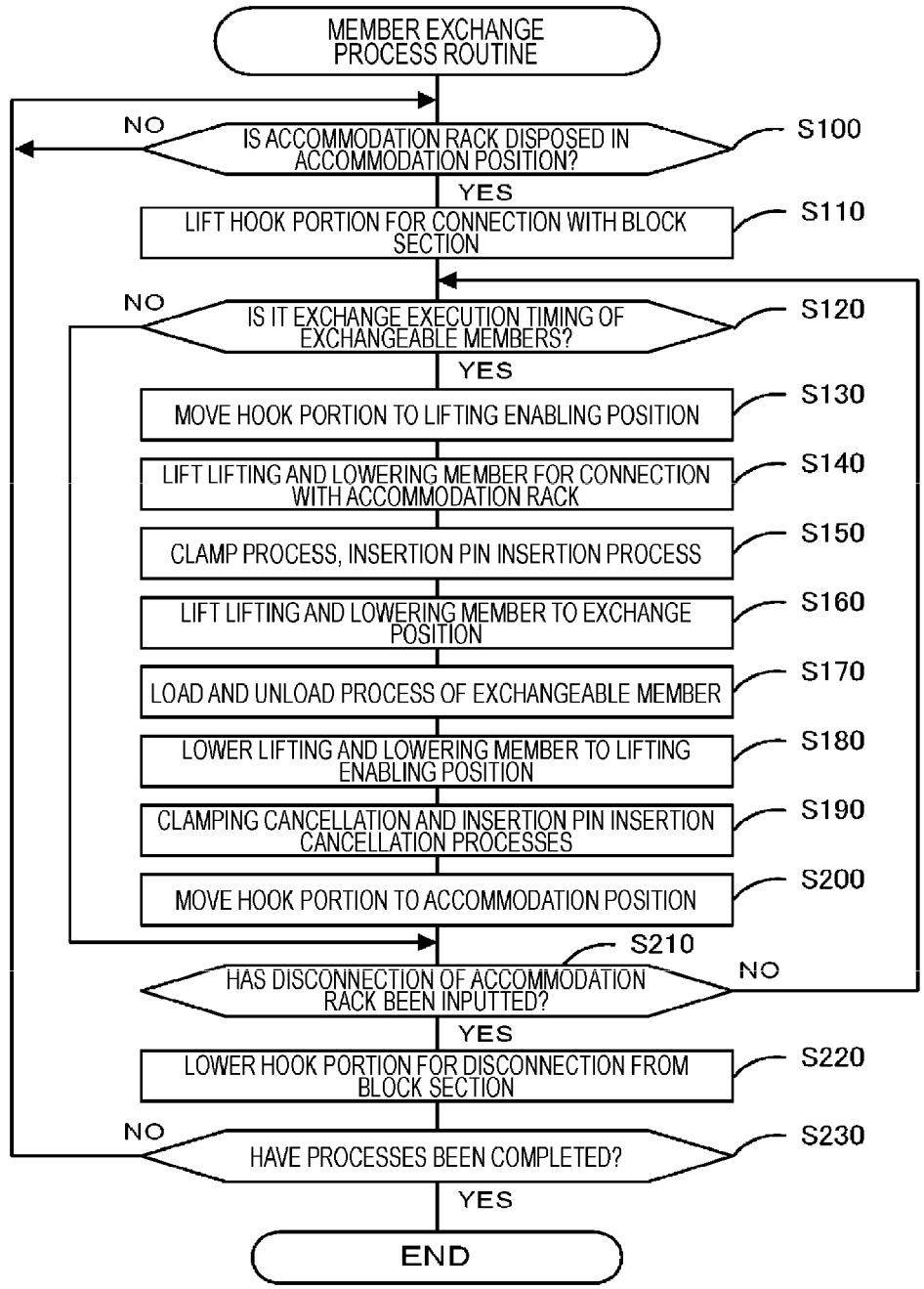
FIG. 9 is a flowchart showing an example of a member exchanging process routine.
Figure 11:
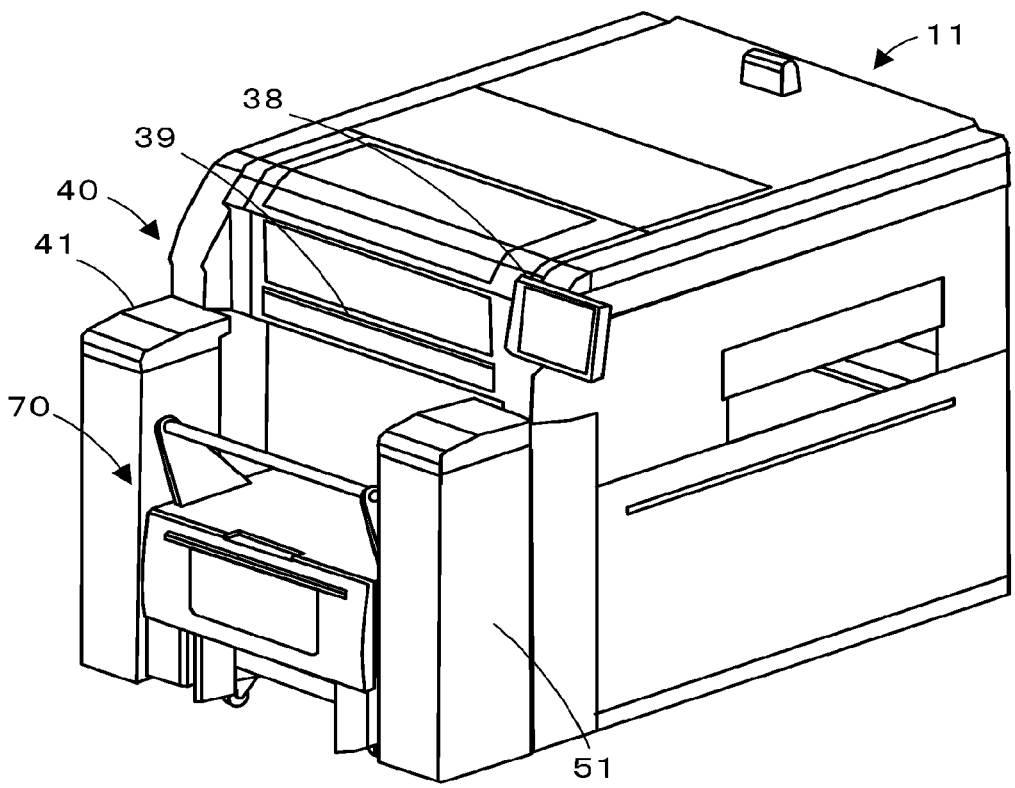
FIG. 11 is a perspective view of printing device 11 when accommodation rack 70 stays in an accommodation position.
Figure 12:
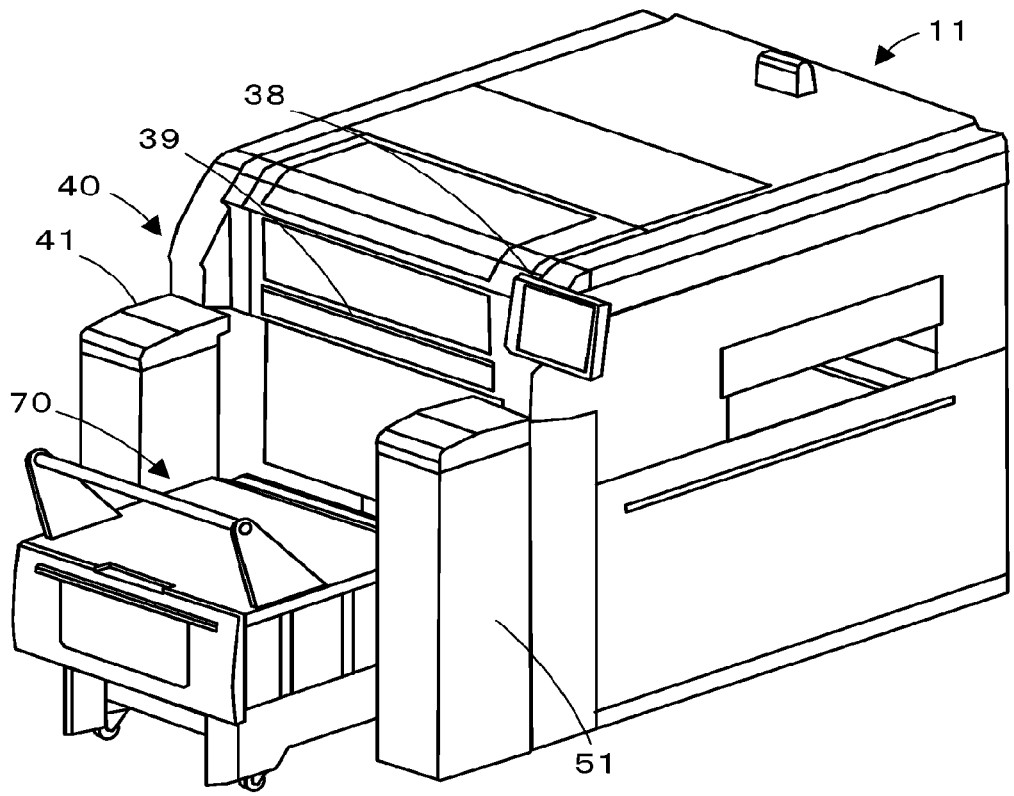
FIG. 12 is a perspective view of printing device 11 when accommodation rack 70 stays in a liftable position.
Figure 13:
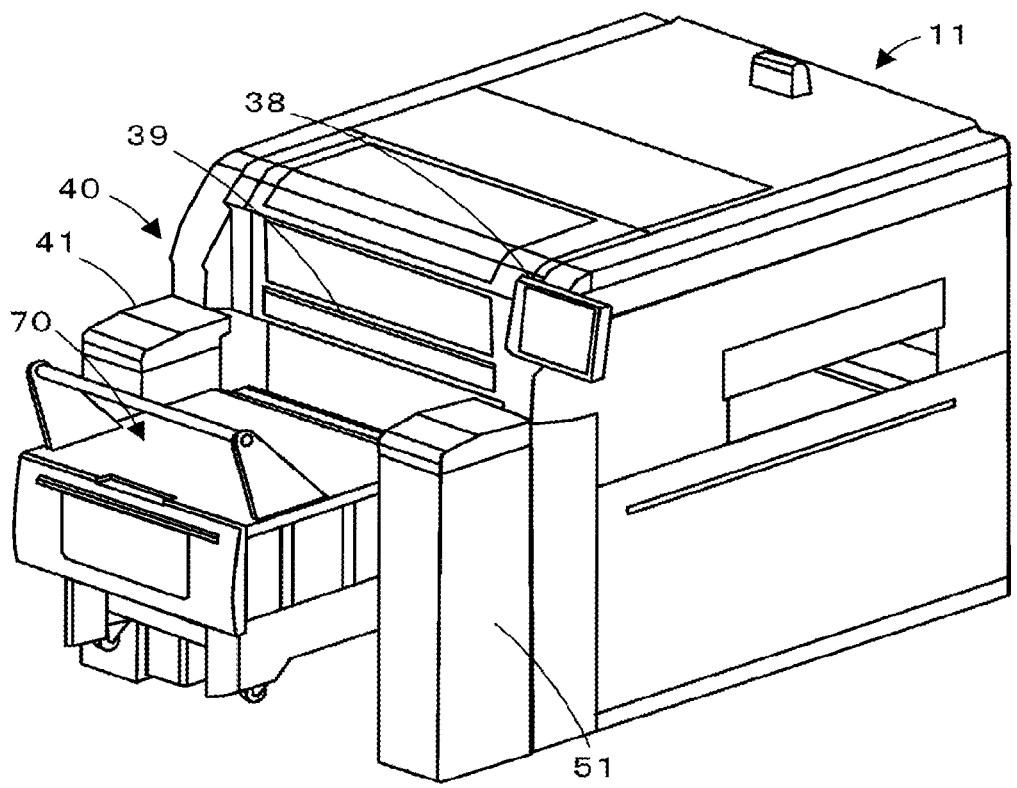
FIG. 13 is a perspective view of printing device 11 when accommodation rack 70 is being lifted up.
Figure 14:
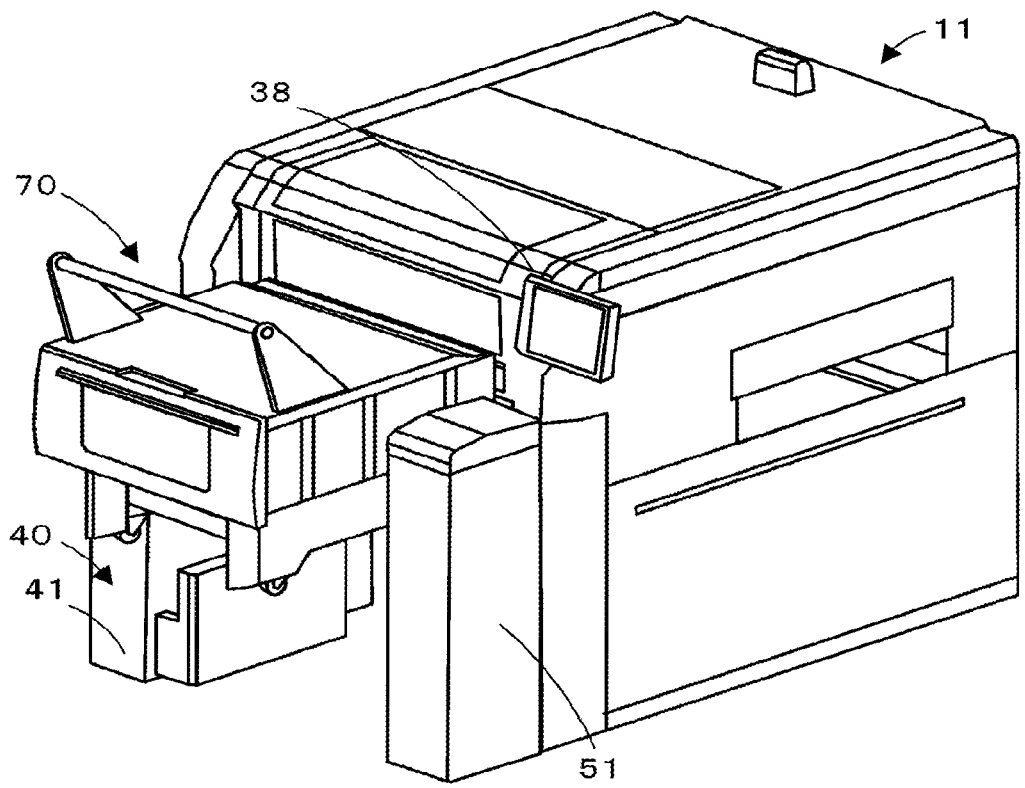
FIG. 14 is a perspective view of printing device 11 when accommodation rack 70 stays in an exchange position.

Next, an operation of exchanging unit 40 for exchanging frames 29 will be described. FIG. 9 is a flowchart showing an example of a member exchanging process routine which is executed by exchange control section 59 of exchanging unit 40. FIG. 10 is an explanatory diagram showing positional relationships among the constituent members such as lifting and lowering member 44, supporting and fixing member 75, and the like when moving accommodation rack 70, in which FIG. 10A is a diagram resulting when accommodation rack 70 stays in the accommodation position, FIG. 10B is a diagram resulting when accommodation rack 70 is connected to forward-backward moving section 46, FIG. 10C is a diagram resulting when accommodation rack 70 is moved to the liftable position, and FIG. 10D is a diagram resulting when accommodation rack 70 is fixed to lifting and lowering member 44. FIG. 11 is a perspective view showing printing device 11 when accommodation rack 70 stays in the accommodation position. FIG. 12 is a perspective view showing printing device 11 when accommodation rack 70 stays in the liftable position. FIG. 13 is a perspective view showing printing device 11 when accommodation rack 70 is being lifted up. FIG. 14 is a perspective view showing printing device 11 when accommodation rack 70 stays in the exchange position.

The member exchange process routine is stored in a storage section of exchange control section 59 and is executed after exchanging unit 40 has been activated. When this routine is executed, CPU of exchange control section 59 determines based on a detection signal from detection section 37 whether accommodation rack 70 is disposed in the accommodation position (S100). When accommodation rack 70 is disposed in the accommodation position (FIG. 11), CPU causes hook portion 47 to be lifted up for connection with block section 76 (S 110, FIG. 10B). When hook portion 47 is inserted into block section 76, forward-backward moving section 46 is allowed to move accommodation rack 70 forwards and backwards. On the other hand, when it is determined in S100 that accommodation rack 70 is not disposed in the accommodation position, CPU waits until accommodation rack 70 is disposed in the accommodation position.

After S110, CPU of exchange control section 59 determines whether it is an exchange execution timing of screen masks M, which are exchangeable members (S120). For example, a time after the production of boards S of a predetermined type ends, a time before the production of boards S of a subsequent type starts, and the like are raised as the exchange timing of screen masks M. When it is an exchange execution timing of exchangeable members, CPU causes forward-backward moving section 46 to move hook portion 47 to the liftable position (S130, FIG. 10C). Then, as shown in FIG. 12, accommodation rack 70 is pulled out so as to be lifted up. Subsequently, CPU causes lifting and lowering member 44 to be lifted up so as to connect to supporting and fixing member 75 of accommodation rack 70 (S140). When lifting and lowering member 44 is caused to be lifted up in the liftable position, cam followers 44a enter receiving sections 77, whereby accommodation rack 70 is connected to lifting and lowering member 44 (FIG. 10D). Subsequently, CPU causes air cylinder 63 to be driven so as to causes clamp section 60a to execute a clamp process, and causes air cylinder 69 to be driven so as to execute an insertion process of insertion pin 65 of stopper section 60b (S150). In fixing section 60, clamp lever 61 is inserted into locking hole 78, and insertion pin 65 is inserted into insertion hole 79, whereby accommodation rack 70 is fixed to lifting and lowering member 44 (FIG. 10D).

Subsequently, CPU of exchange control section 59 causes lifting and lowering member 44 to be lifted up to the exchange position (S160, FIGS. 13 and 14). In the exchange position, accommodation rack 70 is disposed in a position where opening section 72 faces exchange door 39 through which screen masks M can be exchanged (FIG. 14). Subsequently, a signal informing that a loading process and an unloading process of screen masks M, which are exchangeable members, can be executed is outputted to printing control section 21 (S170). Upon receipt of the signal, printing control section 21 executes a process of moving screen mask M into shelf section 71 by use of exchanging section 27. For this, CPU of exchange control section 59 causes accommodation rack 70 to move to a height at which vacant shelf section 71 reaches the exchange position, and thereafter causes accommodation rack 70 to move to a height at which shelf section 71 accommodating screen mask M for subsequent use reaches the exchange position.

When the loading and unloading process of screen masks M ends, CPU of exchange control section 59 causes lifting and lowering member 44 to be lowered to the liftable position (S180, FIG. 12) to thereby cancel the clamping by clamp section 60a while canceling the insertion of insertion pin 65 of stopper section 60b (S190). Then, CPU causes hook portion 47 to move to the accommodation position (S200). Then, accommodation rack 70 moves to the accommodation position (FIG. 11). After S200, or when it is determined in S120 that it is not an exchange execution timing of exchangeable members, CPU determines whether a disconnection of accommodation rack 70 has been inputted from operator W via operation panel 38 (S210). When the disconnection of accommodation rack 70 has been inputted, CPU causes hook portion 47 to be lowered and cancels the connection to block section 76 (S220). On the other hand, when it is determined in S210 that the disconnection of accommodation rack 70 has not yet been inputted, CPU executes the processes from S120 onward. After S220, CPU determines whether all the processes have been completed (S230), and when all the processes have not yet been completed, CPU executes the processes from S100 onward. On the other hand, when it is determined in S230 that all the processes have been completed, CPU ends this routine.

Here, correspondence relationships between the elements of the present embodiment and elements of the present disclosure will be clarified. Receiving section 42 of the present embodiment corresponds to a receiving section of the present disclosure, lifting and lowering section 43 corresponds to a lifting and lowering section, forward-backward moving section 46 corresponds to a moving section, and printing section 22 corresponds to a printing section. In addition, block section 76 corresponds to a block section, hook portion 47 corresponds to a hook portion, and exchange control section 59 corresponds to an engagement control section and a movement control section. In addition, fixing section 60 corresponds to a fixing section, clamp section 60a corresponds to a clamp section, clamp lever 61 corresponds to a clamp lever, locking hole 78 corresponds to a locking hole, stopper section 60b corresponds to a stopper section, insertion pin 65 corresponds to an insertion pin, and insertion hole 79 corresponds to an insertion hole.

In exchanging unit 40 of the present embodiment that has been described heretofore, since the whole of accommodation rack 70 in which screen masks M as exchangeable members are accommodated in multiple shelf sections 71 is lifted and lowered, a lifting and lowering mechanism is not necessary inside accommodation rack 70, thereby making it possible to make the accommodation rack itself compact. In addition, with this exchanging unit 40, since accommodation rack 70 is put in the state in which accommodation rack 70 is pulled inside the housing of printing device 11 when no exchange is performed using accommodation rack 70, printing device 11 itself can also be made more compact. In this way, with this exchanging unit 40, the automatic exchange of exchangeable members for use in printing device 11 can be made more compact.

In addition, forward-backward moving section 46 has hook portion 47 disposed in such a manner as to be lifted and lowered and configured to be lifted up towards block section 76 provided on accommodation rack 70 for engagement with block section 76 and forward-backward drive section 48 configured to move hook portion 47 between the accommodation position and the liftable position. With this exchanging unit 40, accommodation rack 70 can be moved by engagement of hook portion 47 with block section 76 as a result of hook portion 47 being lifted up. In addition, for example, in exchanging unit 40, when accommodation rack 70 moves in the horizontal direction so as to be received in receiving section 42, the engagement with forward-backward moving section 46 can be executed easily in such a received state. Further, with exchanging unit 40, when exchange control section 59 receives a signal informing that accommodation rack 70 has been received in receiving section 42, hook portion 47 is caused to be lifted up for hook portion 47 to be brought into engagement with block section 76. With this exchanging unit 40, accommodation rack 70 can automatically be brought into engagement with forward-backward moving section 46 by exchange control section 59. Further, forward-backward moving section 46 moves accommodation rack 70 in the horizontal direction, and lifting and lowering section 43 has fixing section 60 for restricting accommodation rack 70 from moving in the horizontal direction when accommodation rack 70 moves to the liftable position to be put in the state in which accommodation rack 70 can be lifted and lowered. With this exchanging unit 40, since accommodation rack 70 is fixed to lifting and lowering section 43 by fixing section 60, accommodation rack 70 can be prevented from moving in the horizontal direction, falling, and the like after accommodation rack 70 has been lifted up or the like.

In addition, fixing section 60 has one or both of clamp section 60a having clamp lever 61 which is inserted into locking hole 78 formed in accommodation rack 70 to thereby restrict accommodation rack 70 from moving in the horizontal direction and stopper section 60b having insertion pin 65 which is inserted into insertion hole 79 formed in accommodation rack 70 to thereby prevent accommodation rack 70 from falling by insertion pin 65 being inserted into insertion hole 79 when accommodation rack 70 is lifted up. With this exchanging unit 40, clamp section 60a can prevent the horizontal movement of accommodation rack 70, and stopper section 60b can prevent the fall of accommodation rack 70. Further, since exchanging unit 40 is formed such that length A along the movement direction of frame 29 is shorter than length B of accommodation rack 70, with this exchanging unit 40, the size of the device can be made more compact at the other times than the time when accommodation rack 70 is used. Furthermore, exchanging unit 40 accommodates accommodation rack 70 in the same surface as the front surface of the main body of exchanging unit 40 or further inwards than the front surface of the main body when accommodation rack 70 stays in the accommodation position, whereas when accommodation rack 70 stays in the exchange position, exchanging unit 40 supports accommodation rack 70 in the position which projects further than the front surface of the main body of exchanging unit 40. With this exchanging unit 40, although accommodation rack 70 can project further than the front surface of the main body when accommodation rack 70 is used, when accommodation rack 70 stays in the accommodation position, particularly the size of the device can be made more compact.

In addition, exchanging unit 40 includes left unit 41 disposed at the left side of the housing of printing device 11 and right unit 51 disposed at the right side of the housing, and has lifting and lowering space 49 where accommodation rack 70 is lifted and lowered between left unit 41 and right unit 51. With this exchanging unit 40, since accommodation rack 70 is inserted into lifting and lowering space 49 defined between left unit 41 and right unit 51 for exchange of accommodation racks 70, the exchange of accommodation racks 70 is facilitated more. Further, since accommodation rack 70 includes no power for moving exchangeable members, with this exchanging unit 40, accommodation rack 70 can be made more compact. Furthermore, since printing device 11 includes exchanging unit 40 described heretofore, as with exchanging unit 40 described heretofore, the automatic exchange of exchangeable members for use in printing device 11 can be made compact more.

Here, exchanging unit 40, printing device 11, and mounting system 10 of the present disclosure are not limited to those described in the present embodiment at all, and it is needless to say that exchanging unit 40, printing device 11, and mounting system 10 may be practiced in various aspects without departing from the scope of the present disclosure.

For example, in the present embodiment that has been described heretofore, exchanging unit 40 is described as including hook portion 47 for engagement with block section 76 of accommodation rack 70; however, the present disclosure is not particularly limited thereto, and exchanging unit 40 may be configured to connect with accommodation rack 70 via any other mechanism than hook portion 47. In addition, in the embodiment that has been described heretofore, exchange control section 59 is provided for causing hook portion 47 to be lifted and lowered; however, this exchange control section may be omitted.

In the embodiment that has been described heretofore, exchanging unit 40 is described as including clamp section 60a and stopper section 60b as fixing section 60; however, the present disclosure is not particularly limited thereto, and either of them may be omitted. In addition, any other fixing section than clamp section 60a and stopper section 60b may be adopted. Alternatively, although exchanging unit 40 is described as including fixing section 60, this fixing section 60 may be omitted.

In the embodiment that has been described heretofore, exchanging unit 40 is described as including left unit 41 and right unit 51, and the main bodies of exchanging unit 40 are described as being disposed at the left and right of the housing of printing device 11; however, the present disclosure is not particularly limited thereto, and exchanging unit 40 may be formed into an integrated structure as long as a space accommodating accommodation rack 70 is provided. In addition, exchanging unit 40 is described as being disposed in front of printing device 11, the present disclosure is not particularly limited thereto, and exchanging unit 40 may be disposed at the rear or side of printing device 11.

In the embodiment that has been described heretofore, the receiving section is described as receiving accommodation rack 70 by supporting the left and right end portions of accommodation rack 70 from the lower surface side thereof, however, the present disclosure is not particularly limited thereto as long as the receiving section can receive accommodation rack 70, and, for example, the receiving section may be configured so as to support the whole of the lower surface of accommodation rack 70, or may be configured so as to receive accommodation rack 70 by supporting accommodation rack 70 from a side surface or an upper surface of accommodation rack 70. In addition, in the embodiment that has been described heretofore, exchanging unit 40 is described as receiving accommodation rack 70 by lifting accommodation rack 70 upwards; however, the present disclosure is not particularly limited thereto as long as exchanging unit 40 can receive accommodation rack 70.

Figure 15:
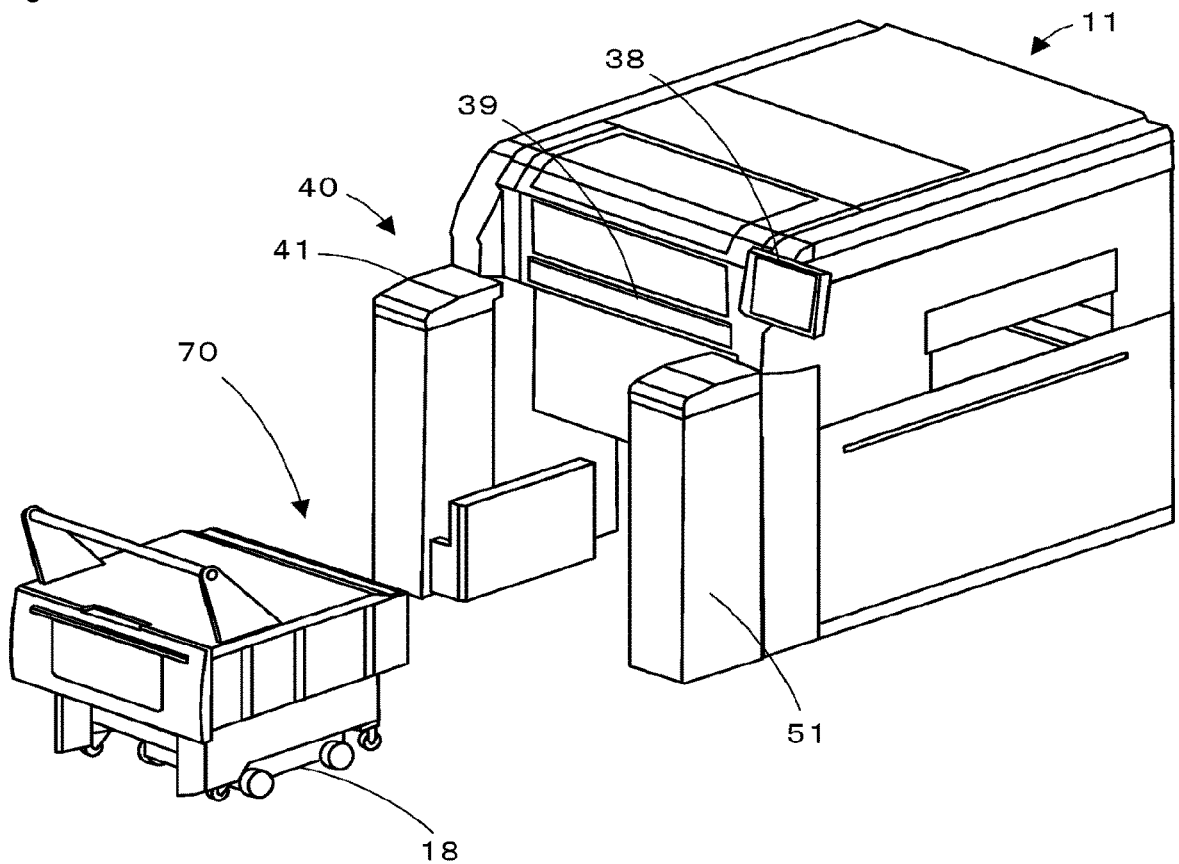
FIG. 15 is an explanatory diagram illustrating a way by which automatic conveyance vehicle 18 moves accommodation rack 70 to exchanging unit 40.

In the embodiment that has been described heretofore, operator W is described as moving accommodation rack 70; however, the present disclosure is not particularly limited thereto, and for example, accommodation rack 70 may be moved by automatic conveyance vehicle 18. FIG. 15 is an explanatory diagram showing an example in which automatic conveyance vehicle 18 moves accommodation rack 70 to exchanging unit 40. Automatic conveyance vehicle 18 may be configured to move accommodation rack 70 by entering the space in the center of caster section 74. Here, handle 73 may be omitted in the case that automatic conveyance vehicle 18 moves accommodation rack 70.

In the embodiment that has been described heretofore, exchanging section 27 is described as being configured as the rod structure having the abutting section disposed on printing head 23; however, the present disclosure is not particularly limited thereto, and exchanging section 27 may be configured as an independent mechanism disposed on any other element than printing head 23. In addition, in the embodiment that has been described heretofore, although exchanging section 27 is described as being configured as the rod mechanism for engagement with frame 29, for example, exchanging section 27 may be configured as a conveyor mechanism on which frame 29 including an exchangeable member is placed for movement.

Figure 16:
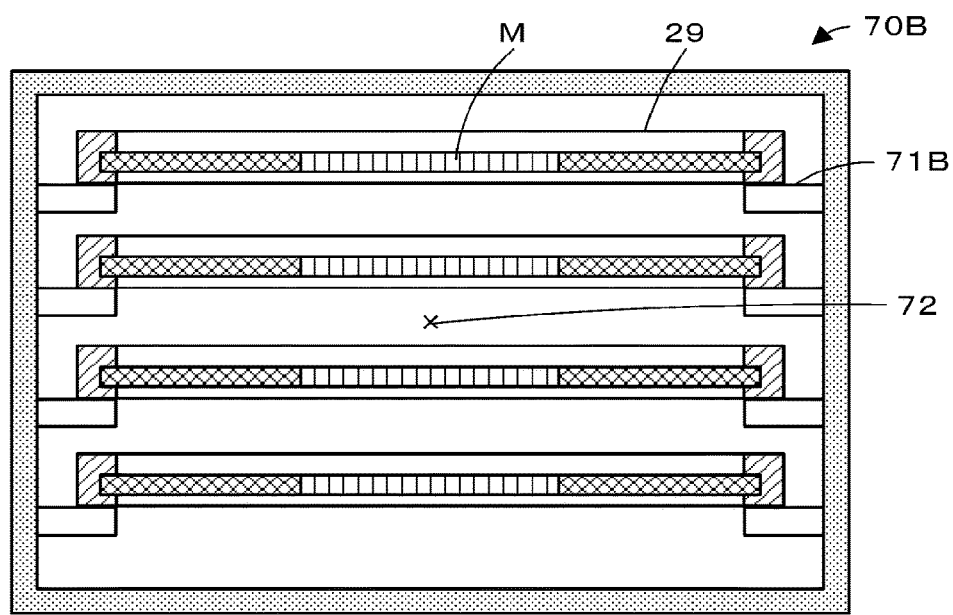
FIG. 16 is an explanatory diagram showing an example of another accommodation rack 70B.

In the embodiment that has been described heretofore, accommodation rack 70 is described as including shelf sections 71 on which frame 29 is placed; however, the present disclosure is not particularly limited thereto, as long as accommodation rack 70 can accommodate multiple frames 29. FIG. 16 is an explanatory diagram showing an example of another accommodation rack 70B. This accommodation rack 70B includes shelf portions 71B into which an end portion of frame 29 is inserted to be supported on left and right sides thereof. With this accommodation rack 70B, shelf sections 71 can be simplified more. In addition, in the embodiment that has been described heretofore, accommodation rack 70 is described as including caster section 74; however, the present disclosure is not particularly limited thereto, and caster section 74 may be omitted, or caster section 74 may be configured so as to be detachable.

In the embodiment that has been described heretofore, accommodation rack 70 is described as having no drive section for moving frame 29; however, the present disclosure is not particularly limited thereto, and accommodation rack 70 may be such as to have a drive section for moving frame 29.

In the embodiment that has been described heretofore, the exchangeable member is described as being screen mask M; however, the present disclosure is not limited thereto as long as the exchangeable member is a member needing to be exchanged, and the exchangeable member may be any one or more in cartridge 36 accommodating a viscous fluid, squeegee 25, cleaning member 34 for use for cleaning screen mask M, support member 32 for supporting board S as a processing target object, and the like, in addition to screen mask M. In addition, the processing target object is described as being board S; however, the present disclosure is not particularly limited thereto, as long as the processing target object constitutes an object on which a viscous fluid can be printed, and the processing target object may include a three-dimensional object or the like. In addition, although the viscous fluid is described as being solder paste, the viscous fluid may be conductive paste, an adhesive, or the like.

In the embodiment that has been described heretofore, the present disclosure is described as disclosing printing device 11 including exchanging unit 40; however, the present disclosure is not particularly to limited thereto, and the present disclosure may be exchanging unit 40. An advantageous effect can be provided which is similar to the advantageous effect provided by the present embodiment that has been described heretofore, as long as exchanging unit 40 can be made to flow to connect with printing device 11.

INDUSTRIAL APPLICABILITY

The present disclosure is applicable to a technical field of devices for performing a component mounting process.

REFERENCE SIGNS LIST 10 mounting system, 11 printing device, 12 print inspection device, 13 mounting device, 14 mounting inspection device, 18 automatic conveyance vehicle, 21 printing control section, 22 printing section, 23 printing head, 24 print moving section, 25 squeegee, 26 mask work section, 27 exchanging section, 28 mask fixing section, 29 frame, 30 board processing section, 31 board conveyance section, 32 support member, 33 cleaning section, 34 cleaning member, 35 supply section, 36 cartridge, 37 detection section, 38 operation panel, 39 exchange door, 40 exchanging unit, 41 left unit, 42 receiving section, 43 lifting and lowering section, 44 lifting and lowering member, 44a cam follower, 45 lifting and lowering drive section, 46 forward-backward moving section, 47 hook portion, 48 forward-backward drive section, 49 lifting and lowering space, 51 right unit, 59 exchange control section, 60 fixing section, 60a clamp section, 60b stopper section, 61 clamp lever, 62 lever rotating section, 63 air cylinder, 64 spring, 65 insertion pin, 66 pin drive section, 67 cam follower, 68 guide member, 69 air cylinder, 70, 70B accommodation rack, 70a rack main body, 71, 71B shelf section, 72 opening section, 73 handle, 74 caster section, 75 supporting and fixing member, 76 block section, 77 receiving section, 78 locking hole, 79 insertion hole, 80 management PC, A, B length, M screen mask, S board, W operator.

The invention claimed is:

1. An exchanging unit for use in a printing device including a printing section configured to execute a printing process of printing a viscous fluid on a processing target object using a screen mask, the exchanging unit comprising:
   a receiving section configured to receive an accommodation rack having multiple shelf sections each configured to accommodate a frame that is capable of supporting an exchangeable member for use in the printing device;
   a lifting and lowering section configured to lift and lower the accommodation rack between an exchange position where to exchange the exchangeable member and a liftable position situated further downwards than the exchange position; and
   a moving section configured to move the accommodation rack between the liftable position where the accommodation rack can be lifted up by the lifting and lowering section and an accommodation position where at least a portion of the accommodation rack enters an interior region of a housing of the printing device configured to temporarily store the accommodation rack,
   wherein the moving section is configured to move the accommodation rack in a front-rear direction of the housing between the liftable position and the accommodation position, and
   wherein a length of the interior region of the housing in the front-rear direction of the housing is shorter than a length of the accommodation rack in the front-rear direction.

2. The exchanging unit according to claim 1,
   wherein the moving section comprises a hook portion disposed in such a manner as to be lifted and lowered and configured to be lifted up to a block section provided on the accommodation rack for engagement with the block section, and a forward-backward drive section configured to move the hook portion between the accommodation position and the liftable position.

3. The exchanging unit according to claim 1, comprising:
   an engagement control section configured to lift the hook portion to bring the hook portion into engagement with the block section upon receipt of a signal informing that the accommodation rack is received in the receiving section.

4. The exchanging unit according to claim 1,
   wherein the moving section moves the accommodation rack in a horizontal direction, and
   wherein the lifting and lowering section comprises a fixing section configured to restrict the accommodation rack from moving in the horizontal direction when the accommodation rack moves to the liftable position to be put in a state in which the accommodation rack can be lifted and lowered.

5. The exchanging unit according to claim 4,
   wherein the fixing section comprises one or both of a clamp section having a clamp lever configured to be inserted into a locking hole formed in the accommodation rack and configured to restrict the accommodation rack from moving in the horizontal direction and a stopper section having an insertion pin configured to be inserted into an insertion hole formed in the accommodation rack and configured to prevent the accommodation rack from falling by the insertion pin being inserted into the insertion hole when the accommodation rack is lifted up.

6. The exchanging unit according to claim 1,
   wherein the exchanging unit is formed such that a length along a movement direction of the frame is shorter than a size of the accommodation rack.

7. The exchanging unit according to claim 1,
   wherein the exchanging unit accommodates the accommodation rack in a same surface as a front surface of a main body of the exchanging unit or further inwards than the front surface of the main body when the accommodation rack stays in the accommodation position and supports the accommodation rack in a position which projects further than the front surface of the main body of the exchanging unit when the accommodation rack stays in the exchange position.

8. The exchanging unit according to claim 1,
   wherein the exchanging unit includes a left unit disposed at a left side of a housing of the printing device and a right unit disposed at a right side of the housing and comprises a lifting and lowering space defined between the left unit and the right unit for lifting and lowering the accommodation rack.

9. The exchanging unit according to claim 1,
   wherein the accommodation rack comprises no power for moving the exchangeable member.

10. A printing device comprising:
   a printing section configured to execute a printing process of printing a viscous fluid on a processing target object using screen mask;
   the exchanging unit according to claim 1; and
   a moving control section configured to cause the moving section to move the accommodation rack from the accommodation position to the liftable position and then cause the lifting and lowering section to lift up the accommodation rack from the liftable position to the exchange position for exchange of the exchangeable member.

* * * * *